US012598781B2

(12) United States Patent
Hitchcock et al.

(10) Patent No.: US 12,598,781 B2
(45) Date of Patent: Apr. 7, 2026

(54) SEMICONDUCTOR SWITCHING DEVICE

(71) Applicant: GE AVIATION SYSTEMS LLC,
Grand Rapids, MI (US)

(72) Inventors: Collin William Hitchcock, Clifton
Park, NY (US); Stacey J. Kennerly,
Niskayuna, NY (US); **Ljubisa D.
Stevanovic**, Clifton Park, NY (US)

(73) Assignee: GE AVIATION SYSTEMS LLC,
Grand Rapids, MI (US)

( * ) Notice: Subject to any disclaimer, the term of this
patent is extended or adjusted under 35
U.S.C. 154(b) by 478 days.

(21) Appl. No.: 18/107,377

(22) Filed: Feb. 8, 2023

(65) Prior Publication Data

US 2024/0266390 A1      Aug. 8, 2024

(51) Int. Cl.
H10D 62/10      (2025.01)
H10D 62/17      (2025.01)
H10D 62/832      (2025.01)

(52) U.S. Cl.
CPC ......... H10D 62/109 (2025.01); H10D 62/127
(2025.01); H10D 62/393 (2025.01); **H10D
62/8325** (2025.01)

(58) Field of Classification Search
CPC .. H10D 62/109; H10D 62/127; H10D 62/393;
H10D 62/8325; H10D 30/66; H10D
62/124; H10D 62/151; H10D 62/292;
H10D 30/63; H10D 62/152; H10D 84/83
USPC .......................................................... 257/77
See application file for complete search history.

(56) References Cited

U.S. PATENT DOCUMENTS

| | | | |
|---|---|---|---|
| 6,015,737 A * | 1/2000 | Tokura ................. | H10D 62/405 |
| | | | 438/270 |
| 6,144,067 A | 11/2000 | Kinzer | |
| 9,716,144 B2 | 7/2017 | Bolotnikov et al. | |
| 9,978,831 B2 | 5/2018 | Yilmaz | |
| 10,056,457 B2 | 8/2018 | Bolotnikov et al. | |
| 10,062,749 B2 | 8/2018 | Chatty et al. | |
| 10,192,958 B2 | 1/2019 | Bolotnikov et al. | |
| 10,388,737 B2 | 8/2019 | Bolotnikov et al. | |
| 10,937,870 B2 | 3/2021 | Bolotnikov et al. | |
| 11,018,228 B2 | 5/2021 | Yen | |
| 11,189,689 B2 | 11/2021 | Furuhashi et al. | |
| 11,444,192 B2 * | 9/2022 | Schöner ............... | H10D 62/393 |

(Continued)

FOREIGN PATENT DOCUMENTS

| | | |
|---|---|---|
| CN | 111146290 A | 5/2020 |
| EP | 2562818 A1 | 2/2013 |

(Continued)

*Primary Examiner* — Mohammad M Hoque
(74) *Attorney, Agent, or Firm* — Fitch, Even, Tabin &
Flannery LLP

(57) ABSTRACT

A semiconductor device cell includes a JFET region adjacent a channel region, the JFET region defining a periphery of the semiconductor device cell. The JFET region includes a first corner region and a second corner region separated by a JFET intermediate region. A first width of the JFET intermediate region extending from an edge of the JFET intermediate region abutting a periphery of the channel region to the periphery of the semiconductor device cell is greater than a second width of the JFET region extending from an edge of at least one of the first corner region and the second corner region abutting the periphery of the channel region to the semiconductor cell periphery.

18 Claims, 9 Drawing Sheets

(56)            References Cited

U.S. PATENT DOCUMENTS

| | | | |
|---|---|---|---|
| 2009/0072304 | A1 | 3/2009 | Adan |
| 2013/0009256 | A1 | 1/2013 | Okumura et al. |
| 2014/0367771 | A1* | 12/2014 | Chatty ................. H10D 62/107 |
| | | | 257/329 |
| 2022/0223691 | A1 | 7/2022 | Cho et al. |

FOREIGN PATENT DOCUMENTS

| | | | |
|---|---|---|---|
| JP | H065158 | A | 1/1994 |
| JP | 2019517150 | A | 6/2019 |

* cited by examiner

FIG. 5 (Pior Art)

SEMICONDUCTOR SWITCHING DEVICE

TECHNICAL FIELD

This disclosure generally relates to semiconductor power devices, such as silicon carbide power devices, and more particularly to a semiconductor device cell having a layout that enables improved semiconductor device performance.

BACKGROUND

Semiconductor devices, such as silicon carbide (SiC) power devices, are widely used in conventional electrical systems to switch or convert electrical power for consumption by a load. Many electronics systems utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors). For example, MOSFETs can be fabricated as discrete transistor packages for high power applications, or as chips with millions of transistors. Many thousands of these transistor "cells" can be combined into one device in order to handle relatively high currents and voltages.

Many conventional MOSFETs use a vertical structure with source and drain terminals at opposite sides of a chip. The vertical orientation eliminates crowding at the gate and offers larger channel widths. Generally, when a semiconductor device is conducting current, the on-state resistance of the device represents its conduction loss, which impacts the efficiency of the device and its cost. That is, conventional semiconductor device cells include a number of internal components that can create resistance to the current flowing through the device.

DETAILED DESCRIPTION

Figure 1:
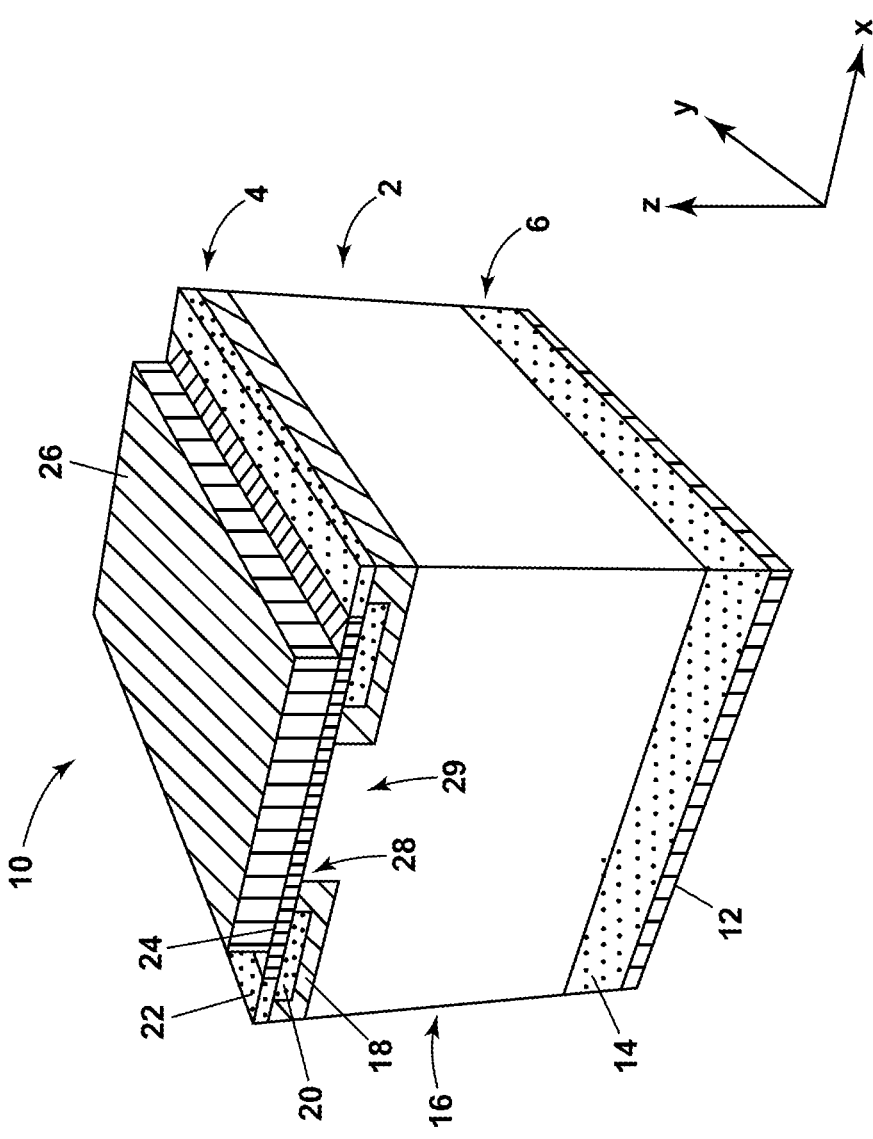
FIG. 1 is a schematic of a typical planar MOSFET device.

Aspects of the disclosure can be implemented in any environment, apparatus, or method for cooling a heat-generating module regardless of the function performed by the heat-generating module.

As used herein, the term "set" or a "set" of elements can be any number of elements, including only one. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one aspect" or "an aspect" of the present disclosure are not intended to be interpreted as excluding the existence of additional aspects that also incorporate the recited features.

It may be appreciated that the shapes, positions, and alignments of features presently disclosed are, for the sake of simplicity, illustrated and described as being relatively ideal (e.g., square, rectangular, and hexagonal cells and shielding regions with perfectly straight and aligned features). However, as may be appreciated by one of skill in the art, process variations and technical limitations may result in cellular designs with less than ideal shapes or irregular features may still be in accordance with the present disclosure. As such, the term "substantially" as used herein to describe a shape, a position, or an alignment of a feature is meant to encompass ideal or target shapes, positions, and alignments as well as imperfectly implemented shapes, positions, and alignments resulting from variability in the semiconductor fabrication process, as may be appreciated by one skilled in the art.

Additionally, semiconductor device cells are described herein as being disposed or fabricated "at the surface," "in the surface," "on the surface," or "along the surface" of a semiconductor layer, which is intended to include semiconductor device cells having portions disposed within the bulk of the semiconductor layer, portions disposed proximate to the surface of the semiconducting layer, portions disposed even with the surface of the semiconductor layer, and/or portions disposed above or on top of the surface of the semiconductor layer.

While terms such as "voltage", "current", and "power" can be used herein, it will be evident to one skilled in the art that these terms can be interrelated when describing aspects of the electrical circuit, or circuit operations.

All directional references (e.g., radial, axial, upper, lower, upward, downward, left, right, lateral, front, back, top, bottom, above, below, vertical, horizontal, clockwise, counterclockwise) are used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. The exemplary drawings are for purposes of illustration only and the dimensions, positions, order and relative sizes reflected in the drawings attached hereto can vary.

As used herein, a controllable switching element, or a "switch" is an electrical device that can be controllable to toggle between a first mode of operation, wherein the switch is very low resistance state or in an "ON" state, or otherwise in a conducting mode, intending to transmit current from a switch input to a switch output, and a second mode of operation, wherein the switch is very high resistance state or in an OFF state, or otherwise in a non-conducting mode, intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

Furthermore, for ease of description and understanding, while various aspects may be discussed below in the context of SiC MOSFET devices, it should be appreciated the present approach may be applicable to other types of MOS-FETS, such as, but not limited to SiC DMOSFETs, UMOS-FETs, and VMOSFETs. It is contemplated that various material systems (e.g., silicon (Si), germanium (Ge), aluminum nitride (AlN), gallium nitride (GaN), gallium arsenide (GaAs), diamond (C), or any other suitable wide band-gap semiconductor) can be used. It is further contemplated that other types of device structures (e.g., UMOSFET, VMOS-FETs, insulated gate bipolar transistors (IGBT), insulated base MOS-controlled thyristors (IBMCT), or any other suitable FET and/or MOS device)) utilizing n-channel or p-channel designs can be used in various non-limiting aspects.

One of the most common solid-state semiconductor switching devices used in modern power electronics is the MOSFET device. While an ideal switch would conduct electrical current with zero electrical resistance when in a low resistance "ON" or conducting state, a MOSFET will always exhibit a finite electrical resistance. Thus, it is generally desirable to reduce the total resistance (e.g., an on-state resistance) to the minimum possible value. It is also desirable to minimize the ON-state resistance of the MOS-FET, without reducing the OFF-state resistance, the switching speed of the device, or both.

Conventional MOSFETs typically consist of arrays of periodic unit cells. Each unit cell can have a respective electrical resistance, and the MOSFET on-state electrical resistance can be defined by the sum of the respective cell resistances in a parallel electrical circuit. Additionally, each unit cell resistance can be defined by a set of respective resistance values of the structural components of the cell coupled in series. The on-state resistance of a particular MOSFET can thus be defined based at least in part on the relative geometric structures of the various functional components within the respective cells.

When a MOSFET is in a conducting or ON-state, electrons flow through each individual cell from a "source metal" on the top surface of a SiC semiconductor body, through various structures defined within the SiC semiconductor body, and into a "drain metal" on the back surface of the body. Each respective MOSFET unit cell surface can include four mutually exclusive, non-overlapping regions referred to herein as the source contact region, the n+/p-well region, the channel/accumulation ("channel") region, and the junction field-effect transistor ("JFET") region. The four regions can be coupled electrically in series, and can occupy substantially the entire area of the respective cell.

The resistive contributions of the source contact and the channel regions to the on-state electrical resistance of the MOSFET are inversely proportional to their respective areas. The resistive contribution of the n+/p-well region to the on-state electrical resistance of the MOSFET is roughly directly proportional to its area. Since the resistive contribution of the channel region is relatively greater than that of the n+/p-well, or the source contact region, the on-state electrical resistance of the MOSFET can be reduced by maximizing the relative area of the channel region in the unit cell with respect to the n+/p-well, or the source contact region. Thus, conventional techniques typically employ MOSFET structures with a maximized relative proportion of the channel region area by arranging the cell geometries to minimize the relative proportion of the n+/p-well region area, or the source contact region area, or both, with respect to the channel region, JFET region or both.

However, for SiC MOSFETs, current fabrication technology can limit such optimization. For example, conventional techniques have focused on reducing MOSFET on-state resistance using periodic cells produced by surrounding a minimum size source contact region with a minimum size n+ region, relative to the channel region. However, the minimum fabricable source contact region dimensions (using conventional fabrication techniques) can be larger than a calculated or determined optimized area. Additionally, enlarging the channel region of adjacent cells can result in off-state breakdown voltage degradation at the cell corners.

Accordingly, as described in more detail herein, in non-limiting aspects, the cells can be arranged to increase the relative proportion of the JFET region between adjacent aligned cells, while maintaining the relative geometry of channel region with respect to the JFET region at the cell corners. In this way, aspects as described herein can thereby arrange a greater net relative proportion of the JFET region area with respect to the source contact region or size n+ region, or both, compared to conventional techniques, and thereby achieve an improved (i.e., lower) on-state resistance for the respective cell than conventional devices. Furthermore, by maintaining the geometry of channel region with respect to the JFET region at the cell corners, while enlarging the JFET region between the corners can avoid the off-state breakdown voltage degradation at the cell corners of some prior art solutions.

As will be described in more detail herein, an undesirable increase in on-state resistance resulting from the increased area of the n+/p-well region (e.g., in the alternating bands), can be negated or overcome within a predetermined dimensional range, due to the decrease in on-state resistance achieved by the corresponding increased area of the JFET region, thereby resulting in a net decrease in the on-state resistance of the respective cell compared to conventional designs.

FIG. 1 illustrates an active cell of a conventional planar n-channel field-effect transistor, such as a DMOSFET, hereinafter MOSFET device 10. It may be appreciated that, in order to more clearly illustrate and describe certain components of the MOSFET device 10, as well as other devices discussed hereinbelow, certain commonly understood design elements (e.g., top metallization, passivation, edge termination, and so forth) may be omitted.

The illustrated conventional MOSFET device 10 of FIG. 1 includes a semiconductor layer 2 (e.g., an epitaxial SiC semiconductor layer) having a first surface 4 and a second surface 6. The semiconductor layer 2 includes a drift region 16 having a first conductivity type (e.g., an n-type drift region 16), a well region 18 having a second conductivity type (e.g., a p-well region 18) disposed adjacent to the drift region 16 and proximal to the first surface 4. The semiconductor layer 2 also includes a source region 20 having the first conductivity type (e.g., an n-type source region 20) adjacent to the well region 18 and proximal to the first surface 4.

A source contact 22 is disposed on top of the first surface 4, partially covering source region 20 and well region 18.

A dielectric layer 24 (also referred to as a gate insulating layer or gate dielectric layer) is disposed on a portion of the first surface 4 of the semiconductor layer 2, and a gate electrode 26 is disposed on the dielectric layer 24.

The second surface 6 of the semiconductor layer 2 is a substrate layer 14 (e.g., a SiC substrate layer), and the drain contact 12 is disposed on the bottom of the MOSFET device 10 along the substrate layer 14.

During on-state operation, an appropriate gate voltage (e.g., at or beyond a threshold voltage ($V_{TH}$) of the MOSFET device 10) can cause an inversion layer to be formed in a channel region 28, as well as a conductive path to be enhanced in a junction field-effect transistor (JFET) region 29 due to accumulation of carriers, allowing current to flow from the drain contact 12 (i.e., the drain electrode) to the source contact 22 (i.e., the source electrode). It should be appreciated that, for the MOSFET devices discussed herein, the channel region 28 may be generally defined as an upper portion of the well region 18 disposed below the gate electrode 26 and the dielectric layer 24.

Figure 2:
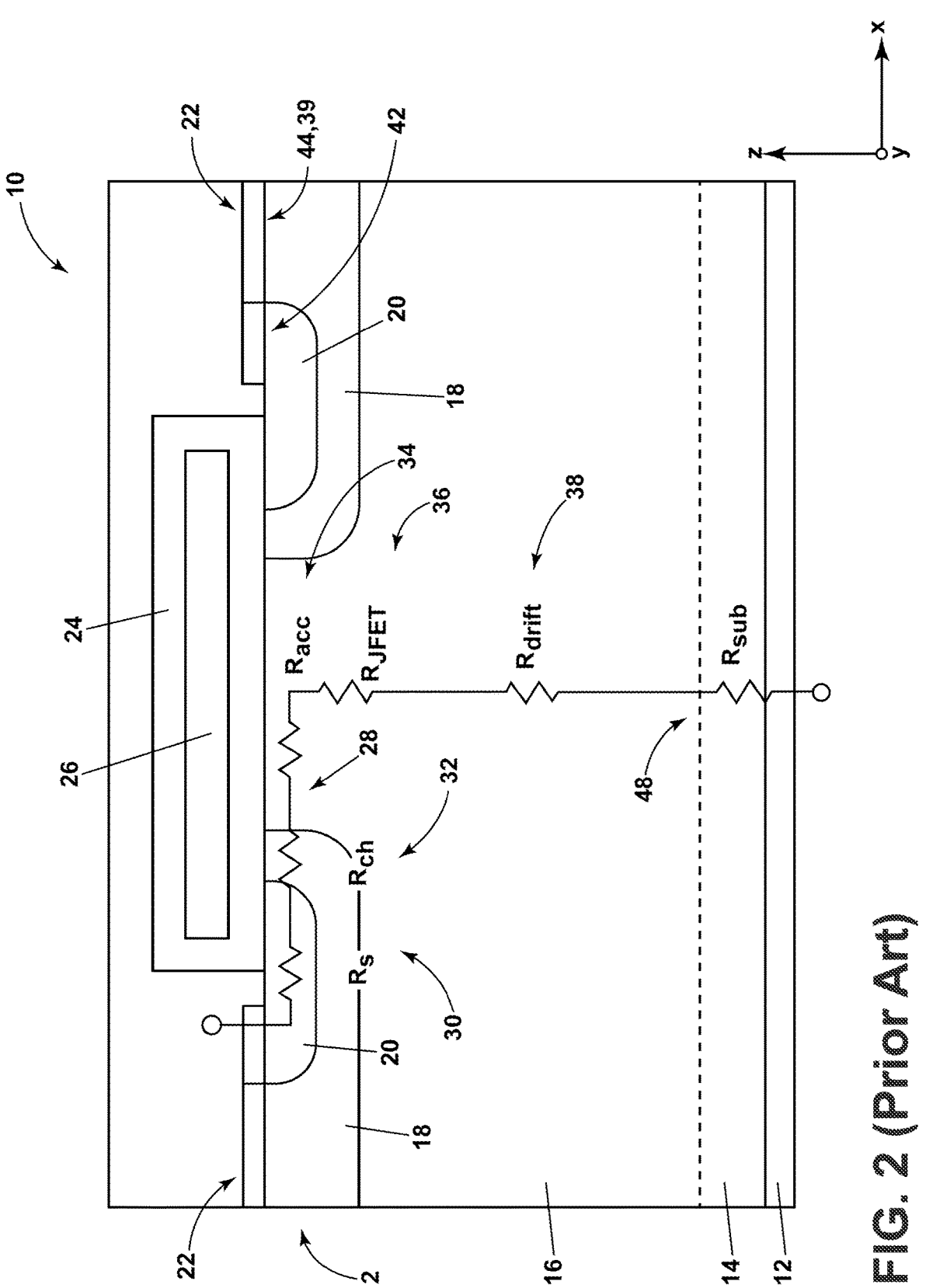
FIG. 2 is a schematic illustrating resistance for various regions of a typical MOSFET device.

FIG. 2 is a schematic cross-sectional view of the conventional MOSFET device 10 of FIG. 1. The source contacts 22 of the MOSFET device 10 illustrated in FIG. 2 generally provide an ohmic connection to the source electrode, and are disposed over both a portion of the source regions 20 and a portion of the well regions 18. The source contact 22 is generally a metallic interface comprising one or more metal layers situated between these semiconductor portions of the MOSFET device 10 and the metallic source electrode.

For clarity, the portion of the source region 20 (e.g., an n+ source region 20) of the MOSFET device 10 disposed below the source contact 22 may be more specifically referred to herein as a source contact region 42 of the MOSFET device 10. Similarly, a portion of the well region 18 (e.g., a p-well region 18) of the MOSFET device 10, which may be p+ doped at a higher level than the remainder of the well region 18, may be more specifically referred to herein as a body region 44 (e.g., p+ body region 44) of the MOSFET device 10. For clarity, the portion of the body region 44 that is disposed below (e.g., covered by, directly electrically connected to) the source contact 22, may be more specifically referred to herein as the body contact region 44 (e.g., p+ body contact region 44) of the MOSFET device 10.

For consistency, portions of the source contact 22 may be designated herein based on the portion of the semiconductor device that is disposed below the source contact 22. For example, the portion of the source contact 22 disposed above the body contact region 44 may be referred to herein as the body contact portion of the source contact 22. Similarly, the portion of the source contact 22 disposed above a source contact region 42 of the MOSFET device 10 may be referred to herein as a source contact portion of the source contact 22.

As illustrated schematically in FIG. 2, the various regions of the MOSFET device 10 may each have an associated resistance, and a total resistance (e.g., an ON-state resistance, Rds(on)) of the MOSFET device 10, which may be represented as a sum of each of these resistances. For example, as illustrated in FIG. 2, ON-state resistance, Rds(on), of the MOSFET device 10 may be approximated as a sum of: a source region resistance 30 (e.g., Rs, a resistance of source region 20 and a resistance of the source contact 22); an inversion channel resistance 32 (e.g., Rch, an resistance of the channel region 28 illustrated in FIG. 2); an accumulation layer resistance 34 (e.g., Racc, a resistance of an accumulation layer between the dielectric layer 24 and portion of drift region 16 located between well regions 18); a JFET region resistance 36 (e.g., RJFET, resistance of undepleted neck region between well regions 18); a drift region resistance 38 (e.g., Rdrift, the resistance about the drift region 16); and a substrate layer resistance 48 (e.g., Rsub, the resistance about the substrate layer 14). Note that the resistances illustrated in FIG. 2 are not intended to be exhaustive, and that other resistances (e.g., drain contact resistance, spreading resistance, etc.) could potentially be present within the MOSFET device 10.

In certain cases, one or two resistance components illustrated in FIG. 2 may dominate conduction losses of the MOSFET device 10, and addressing these factors can significantly impact the ON-state resistance Rds(on). For example, for devices in which the drift resistance 38, the substrate layer resistance 48 and the contact resistance are negligible, such as low-voltage devices or devices suffering from low inversion layer mobility (e.g., SiC devices), the channel resistance 32 may account for a significant portion of device conduction losses.

By further example, in medium-voltage and high-voltage devices, JFET region resistance 36 may account for a significant portion of total conduction losses. In some cases, the MOSFET channel and JFET can comprise approximately 55% of a typical semiconductor device on-state resistance.

Figure 3:
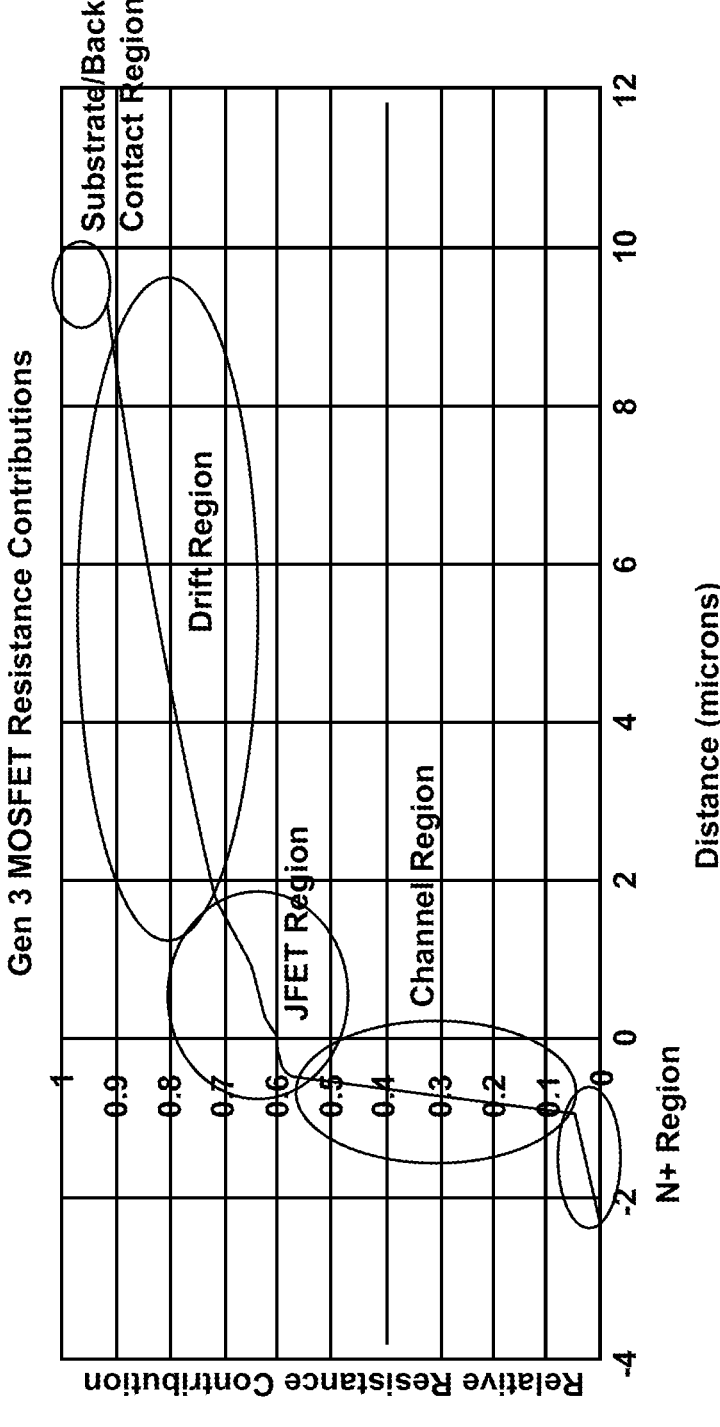
FIG. 3 is a chart depicting the relative resistance contributions of the regions of the MOSFET device structure of FIG. 2.

With reference to FIG. 3, a chart depicting an example of the relative resistance contributions of the various regions of the MOSFET device structure of FIG. 2 is illustrated. The relative resistance for each region is depicted as a function of the respective region distance (e.g., path length). It can be seen that the inversion channel resistance 32 of the channel region 28 can be the largest contributor to the ON-state resistance Rds(on) of the MOSFET device 10, while the source region resistance 30 (e.g., a resistance of source region 20 and a resistance of the source contact 22), and substrate layer resistance 48 (e.g., the resistance about the substrate layer 14), contribute the least resistance to the ON-state resistance Rds(on) of the MOSFET device 10.

Figure 4:
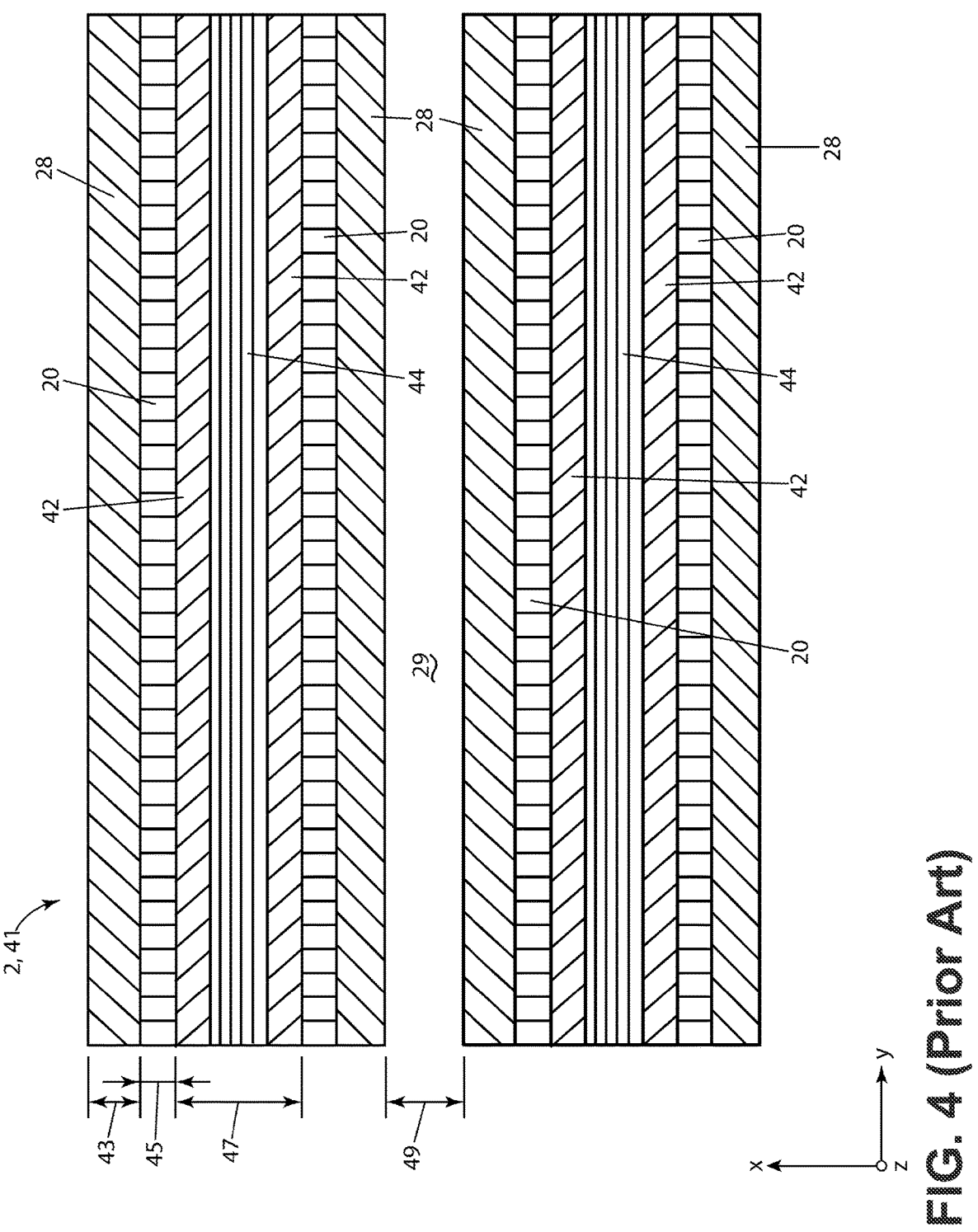
FIG. 4 is a top-down view of a surface of a SiC layer that includes a typical MOSFET device structure having a stripe cell layout.

FIG. 4 illustrates a top-down view of a conventional semiconductor layer 2 including a MOSFET device structure 41 having a conventional stripe cell layout. (i.e., a non-cellular layout). The illustrated stripe layout of FIG. 4 includes: the channel regions 28, source regions 20, source contact regions 42, body contact regions 44, and JFET region 29. It may be appreciated that a set of source contact regions 42 and a set of body contact regions 44 can be formed as continuous stripes along the surface of the semiconductor for the illustrated stripe layout of FIG. 4.

In terms of dimensions, the conventional MOSFET device structure 41 may be described as having the channel region 28 having a particular channel length 43, a distance 45 from channel region 28 to source region 20, a width 47 of the source and body contact regions 42, 44, and a width 49 of the JFET region 29. While the conventional stripe cell layout illustrated in FIG. 4 offers good reliability (e.g., long term and high temperature performance), the relatively high channel resistance 32 and JFET resistance 36 of the MOSFET device structure 41 results in a relatively high ON-state resistance Rds(on), which diminishes the electrical performance of the device.

Figure 5:
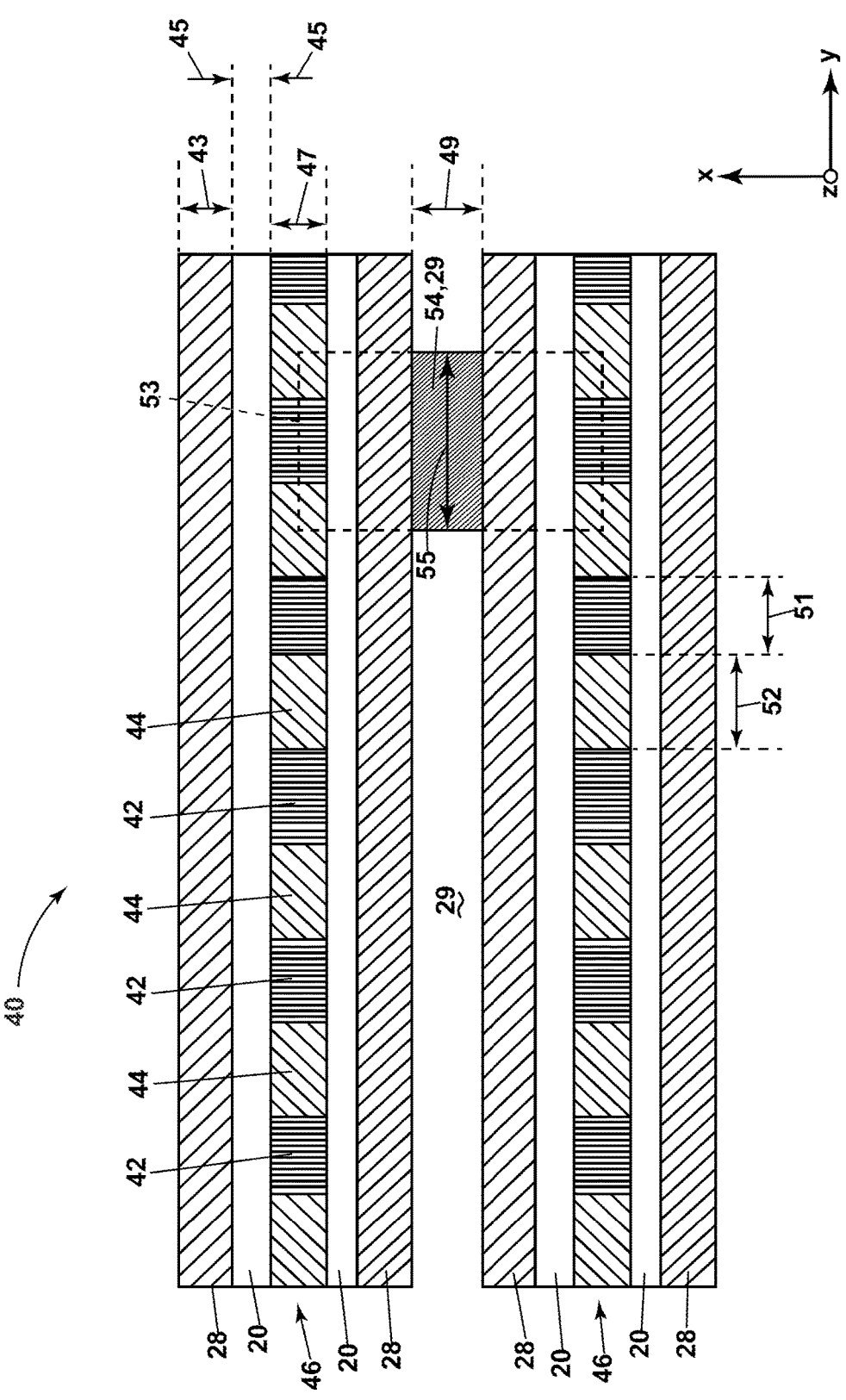
FIG. 5 is a top-down view of a surface of a SiC layer that includes a typical MOSFET device structure having a stripe cell layout.

An example of another conventional device layout is illustrated in FIG. 5, which is a top-down or plan view of a stripe ladder device layout 40 (i.e., a non-cellular layout)

with segmented source/body contacts. The illustrated stripe ladder device layout 40 includes: channel regions 28, source regions 20, a set of segmented source/body contacts 46 (including the body contact region 44 and the source contact region 42) and JFET region 29. FIG. 5 further illustrates dimensions of the stripe ladder device layout 40, including: the channel region 28 having a channel length 43, the distance 45 from the channel to the source region 20, the width 47 of the source and body contact regions 42, 44, the width 49 of the JFET region 29, segment length 51 of the source contact region 42, segment length 52 of the body contact region 44, subset of device area 53, and a width 55 of a JFET area 54 within subset of device area 53 for the illustrated stripe ladder device layout 40.

Figure 6:
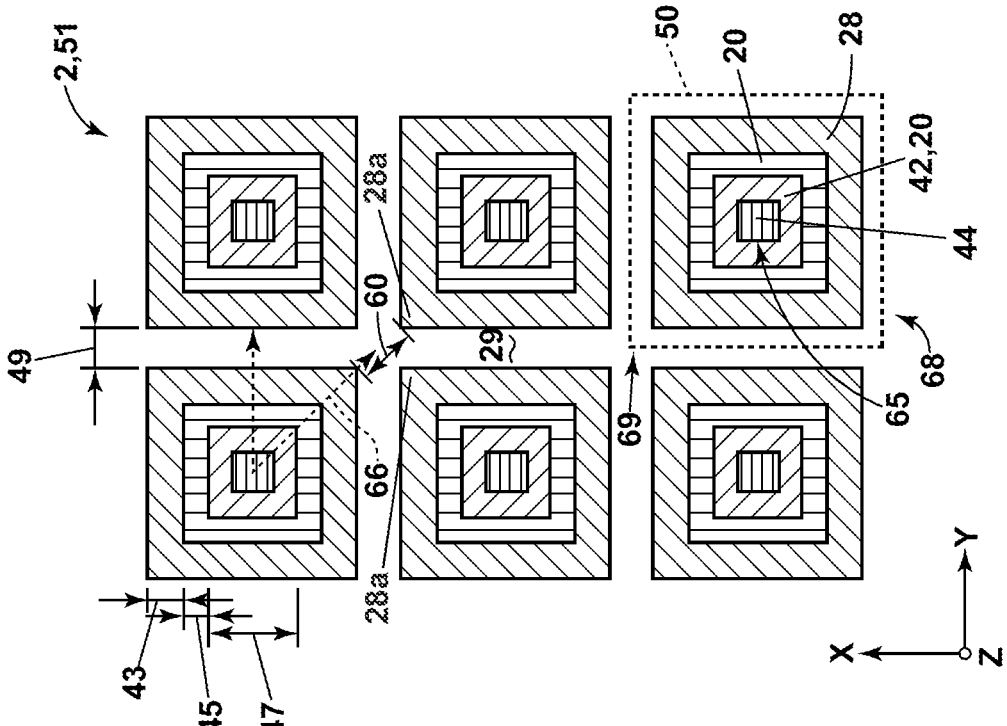
FIG. 6 is a top-down view of a surface of a SiC layer that includes a typical MOSFET device structure having a cellular layout.

For further comparison, another example of a conventional device layout is illustrated in FIG. 6. It may be appreciated that the layouts illustrated herein using a few device cells that represent a subset of the numerous device cells of a semiconductor device on the surface of the semiconductor layer 2. It may be further appreciated that for FIGS. 4-6, as well as for the top-down views of device cells presented below, certain features of the device cells (e.g., gate electrode 26, dielectric layer 24, source contact 22) can be omitted to provide an unobstructed view of the surface of the semiconductor layer 2. In particular, FIG. 6 illustrates a set of device cells 50 in an aligned layout, that is, where the device cells 50 are not staggered or offset from each other.

In general, the illustrated conventional cell design and layout illustrated in FIG. 6 can enable reduced values of Rd (on) by reducing both channel resistance 32 and the JFET resistance relative to a conventional stripe cell layout, as illustrated in FIG. 5. For example, the device cells 50 of FIG. 6 provide an approximately 20% lower Rd (on) than the stripe MOSFET device structure 41 of FIG. 5 assuming similar fabrication process-limited dimensions.

In FIG. 6, the illustrated conventional device cell 50 includes the body contact region 44 disposed in the center region 65 of each cell that, as illustrated in FIG. 1B, can be part of the well region 18. The body contact region 44 is surrounded by the source region 20. More specifically, the body contact region 44 of each cell 50 may be surrounded by the source contact region 42 of the source region 20, wherein the doping of the source contact region 42 may be the same as the remainder of the source region 20. The source region 20 of each cell 50 is surrounded by a channel region 28, which also is part of the well region 18, as illustrated in FIG. 1. The channel region 28 is, in turn, surrounded by the JFET region 29.

While the device layout illustrated in FIG. 6 may enable lower ON-state resistance Rds(on) relative to a stripe cell layout, as illustrated in FIG. 5, it is recognized that such designs can have a substantially higher electric field in portions of the JFET region 29 between the corners of the well regions 18 of neighboring device cells 50 under blocking conditions. For SiC MOS devices, the electric field in the dielectric layer 24 (e.g., silicon dioxide (SiO2)) disposed over the JFET region 29 (illustrated in FIGS. 1 and 2) can be around ten times higher compared to that in silicon devices when the device cells 50 operate under reverse bias. While SiC is generally robust toward higher electric fields, the dielectric layer 24 may experience breakdown during long term operation, resulting in reliability issues with the device cells 50.

In particular, in a SiC MOSFET under reverse bias, the electric field present in the widest portion of the JFET region 29 between respective adjacent corners 28a of the channel regions 28 of neighboring device cells 50, at the corner 69 where neighboring device cells 50 meet (illustrated a distance 60, along the diagonal arrow 66 in FIG. 6) is substantially higher than in other portions of the JFET region 29. Accordingly, it would be desirable to reduce the size of the JFET region 29 between the corners 28a of the channel regions 28 of neighboring device cells 50.

Figure 7:
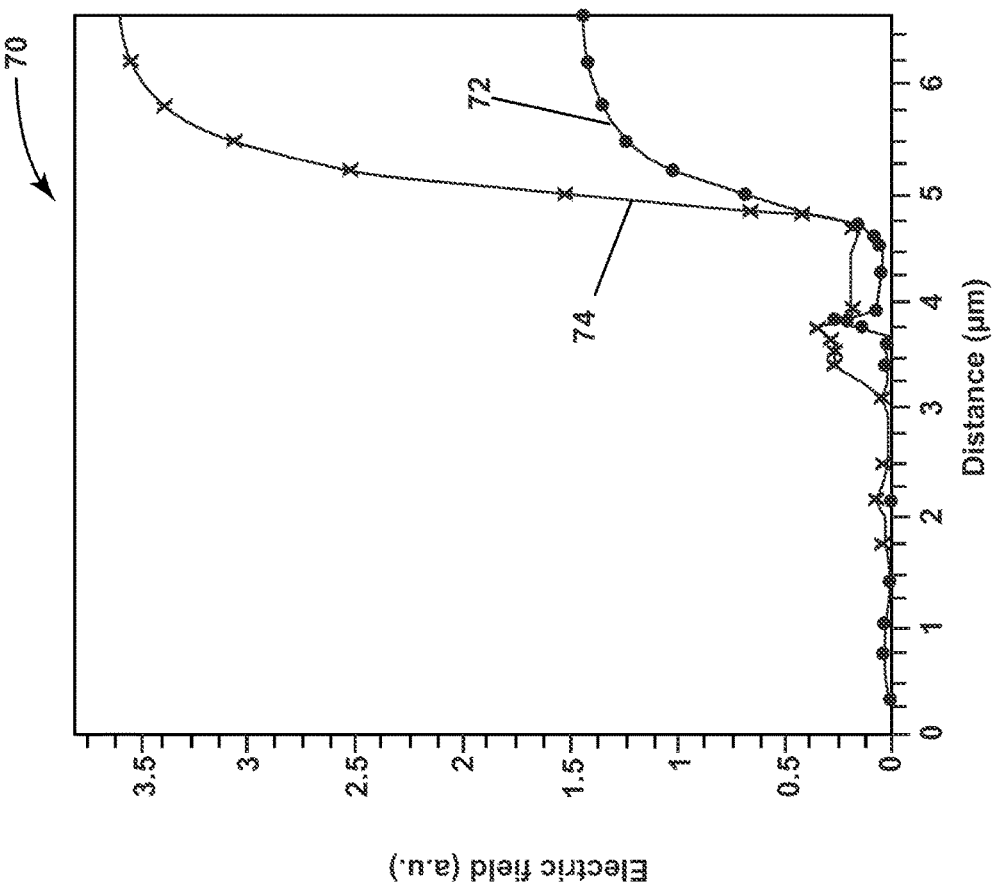
FIG. 7 is a graph depicting normalized electric field strength in a portion of a SiC layer and in a portion of a dielectric layer disposed over the SiC layer, wherein the portion of the SiC layer is disposed between the corners of the well regions of conventional square device cells under reverse bias.

FIG. 7 is a graph 70 that plots the strength of the electric field (in arbitrary units (au)) for portions of a conventional SiC device cell 50 under reverse bias, wherein the portions are linearly disposed along the diagonal arrow 66 illustrated in FIG. 6. The graph 70 of FIG. 7 includes a first curve 72 illustrating the electric field in the semiconductor layer 2, and includes a second curve 74 illustrating the electric field in the dielectric layer 24 disposed over the semiconductor layer 2 (shown in FIG. 1).

As illustrated in FIG. 7, at the center of the conventional SiC device cell 50 (i.e., at x=0 μm) the electric field is low, and, moving diagonally through the corner of the conventional device cell 50, the electric field increases to a peak field strength in the middle of the JFET region 29. The peak or maximum electric field between cell corners (i.e., distance 60, along the diagonal arrow 66 of FIG. 6) is approximately 20% higher than the peak or maximum electric field would be between parallel portions of the device cells 50 (i.e., width 49, along the arrow 64 of FIG. 3). As a result, as shown in FIG. 7, the peak electric field in the dielectric layer 24 is greater between the corners of the well regions 18 of neighboring device cells 50 (e.g., between the corners of the channel regions 28 of neighboring device cells 50, at the corner 69 where neighboring device cells 50 meet), which may result in long term reliability issues for such unshielded device cells 50.

With the foregoing in mind, present aspects are directed toward semiconductor device designs and layouts that enable improved semiconductor device performance. In particular, aspects as disclosed herein are configured to reduce the electric field in the JFET regions 29 (as well as in the dielectric layer 24 illustrated in FIG. 1) in locations where the corners 69 of neighboring device cells 50 meet without significantly increasing the ON-state resistance Rds (on) of the semiconductor device cell 50.

Accordingly, the presently disclosed aspects are arranged having portions of the JFET region 29 with an increased width relative to the portions of the JFET region 29 at the cell corners 69, so that the distance between channel regions 28 at the corners 69 of neighboring device cells 50 is less than the distance between parallel portions of the channel regions 28 of the neighboring device cells 50. Therefore, the present aspects can ensure no portion of the JFET region 29 is wider than the width of the JFET region 29 between parallel portions of the channel regions 28 of neighboring device cells 50.

Figure 8:
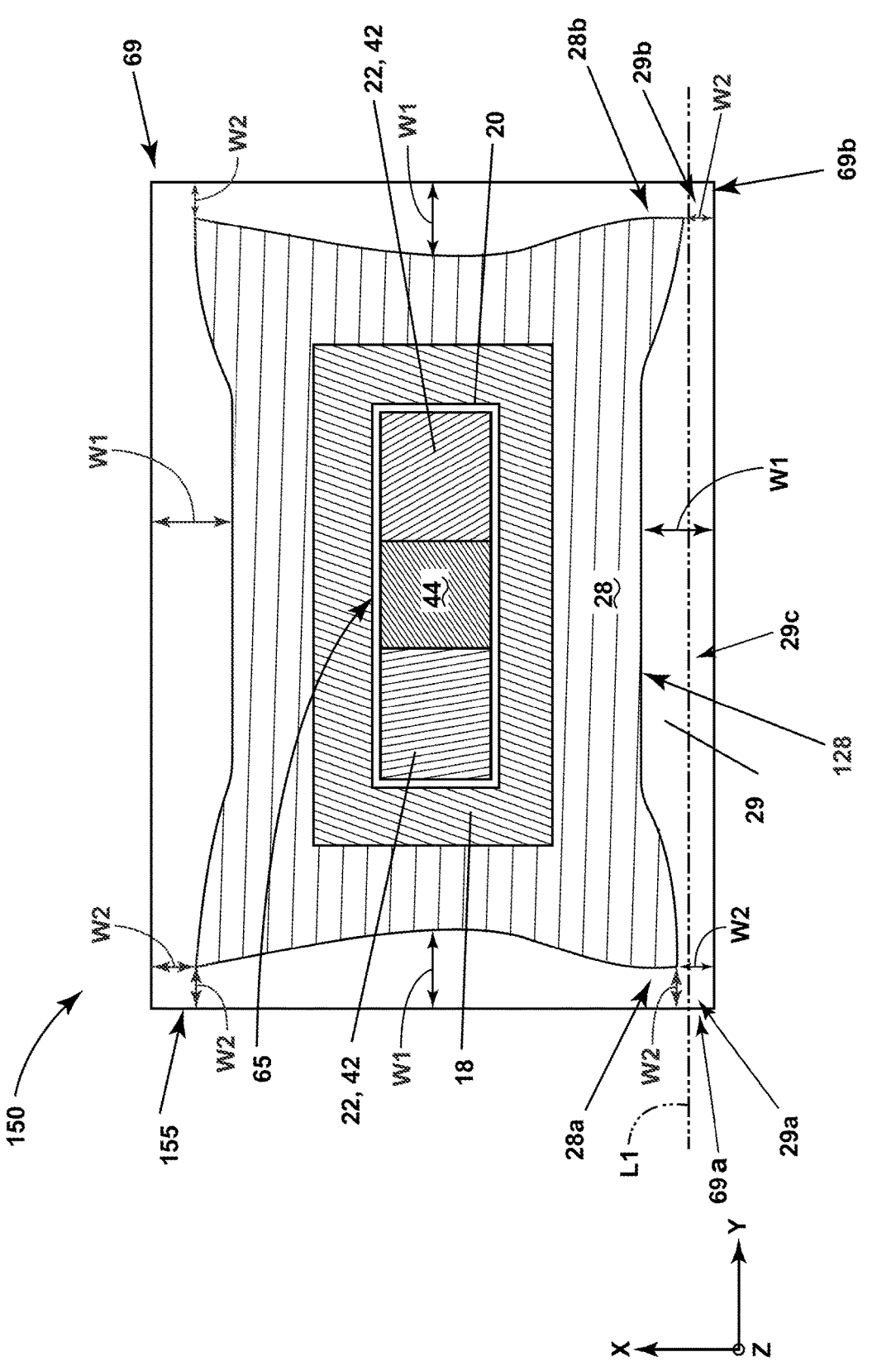
FIG. 8 is a top-down view of a single semiconductor device cell in accordance with various aspects described herein.

FIG. 8, depicts a top-down or plan view illustrating an example of a non-limiting aspect of a single semiconductor device cell 150 in accordance with a non-limiting aspect. As described in more detail herein, the semiconductor device cell 150 can be configured to enable a reduced ON-state resistance Rds(on) of the MOSFET device 10 compared to conventional techniques. It should be appreciated that while the illustrated example of FIG. 8 depicts a semiconductor device cell 150 having a square geometry, other aspects are not so limited. In other non-limiting aspects, the device cells 150 can have any other desired geometry or shape including, without limitation, elongated rectangular, hexagonal, polygonal, rounded, curved, varying width, elongated or distorted shapes, and various combinations thereof.

The semiconductor device cell 150 can be disposed at the first surface 4 of a semiconductor layer 2 (e.g., a silicon carbide (SiC) semiconductor layer). The semiconductor device cell 150 can include a drift region 16 having the first conductivity type (as illustrated in FIG. 1). The semiconductor device cell 150 can have a cell periphery 155 or boundary, and a center region 65. In non-limiting aspects, the cell periphery 155 can define a set of cell corners 69. For example, the set of cell corners 69 can include a first cell corner 69a and a second cell corner 69b.

The semiconductor device cell 150 can further include the body contact region 44, the source contact region 42, the source region 20, the channel region 28, the well region 18, and the JFET region 29. It may be appreciated that the semiconductor layer 2, the source region 20, including the source contact region 42, and the JFET region 29 can have a first conductivity type (e.g., n-type), while well region 18, including the body contact region 44 and the channel region 28 can have a second conductivity type (e.g., p-type).

As illustrated in FIG. 8, the body contact region 44 can be disposed in the center region 65 that, as illustrated in FIG. 1, can be part of the well region 18. The body contact region 44 can be surrounded by the source region 20 of the first conductivity type (e.g., an n-type. or a p-type). A periphery of the source region 20 can be surrounded by well region 18, which can in turn be surrounded by the channel region 28 of the second conductivity type. It may be appreciated that, in some aspects, portions of the source region 20 disposed below the source contact 22 can serve as portions of the source contact region 42 of the semiconductor device cell 150. More specifically, the body contact region 44 of the semiconductor device cell 150 may be surrounded by the source contact region 42 of the source region 20, wherein the doping of the source contact region 42 may be the same as the remainder of the source region 20. The channel region 28 can be, in turn, surrounded by the JFET region 29.

The JFET region 29 can be arranged about the cell periphery 155 of the semiconductor device cell 150. The JFET region 29 can be adjacent the channel region 28 at the cell periphery 155. The JFET region 29 can include a set of corners disposed at and defining the cell corners 69. For example, the JFET region 29 can include a first corner region 29a and a second corner region 29b. As such, the JFET region 29 can define the cell periphery 155, or the cell corners 69, or both. At least a portion of the JFET region 29 can define a longitudinal axis L1 along a length or side of the periphery 155. The JFET region 29 along the length or side of the periphery 155 includes a first corner region 29a and an opposing second corner region 29b separated by a JFET intermediate region 29c.

In non-limiting aspects, the channel region 28 can define one or more corners 28a, 28b. The corners 28a, 28b can define a right angle. As illustrated, in some aspects, each of the corners 28a, 28b can be proximal to a corresponding JFET corner region 29a, 29b. In non-limiting aspects, a respective first corner 28a of the channel region 28 can be proximal to the JFET region first corner region 29a, and a second corner 28b of the channel region 28 can be proximal to the JFET region second corner region 29b.

The JFET intermediate region 29c can define a first width W1. The first width W1 can extend across the JFET intermediate region 29c orthogonal to the longitudinal axis L1. In aspects, the first width W1 can extend from an edge of the JFET intermediate region 29c abutting a periphery 128 of the channel region 28 to the cell periphery 155.

At least one of the first corner region 29a and second corner region 29b can define a second width W2. The second width W2 can extend across the JFET region 29 orthogonal to the longitudinal axis L1. In aspects, the second width W2 can extend from an edge of one of the first corner region 29a or second corner region 29b of the JFET region 29 abutting the periphery 128 of the channel region 28 to the cell periphery 155.

In non-limiting aspects, the first width W1 is greater than the second width W2. In non-limiting aspects, the first width W1 can be about 0.7 microns, and the second width W2 can be about 0.25 microns. In other aspects, the first width W1 can be within a range of 0.3-1.2 microns, and the second width W2 can be within a range of 0.07-0.4 microns. In still other aspects, the first width W1 can be at least 20% wider that the second width W2.

Other aspects are not so limited, and the dimensions of the first width W1, or the second width W2, or both, can vary as desired for various applications without departing from the scope of the disclosure herein. Regardless of the dimensions, or relative dimensions with respect to each other, or both, of the first width W1 and second width W2 are arranged or defined with the particular purpose of decreasing the ON-state resistance contribution of the JFET region 29, while maintaining robustness to breakdown voltages between the corners of neighboring semiconductor device cells 150, as illustrated in FIG. 9.

Figure 9:
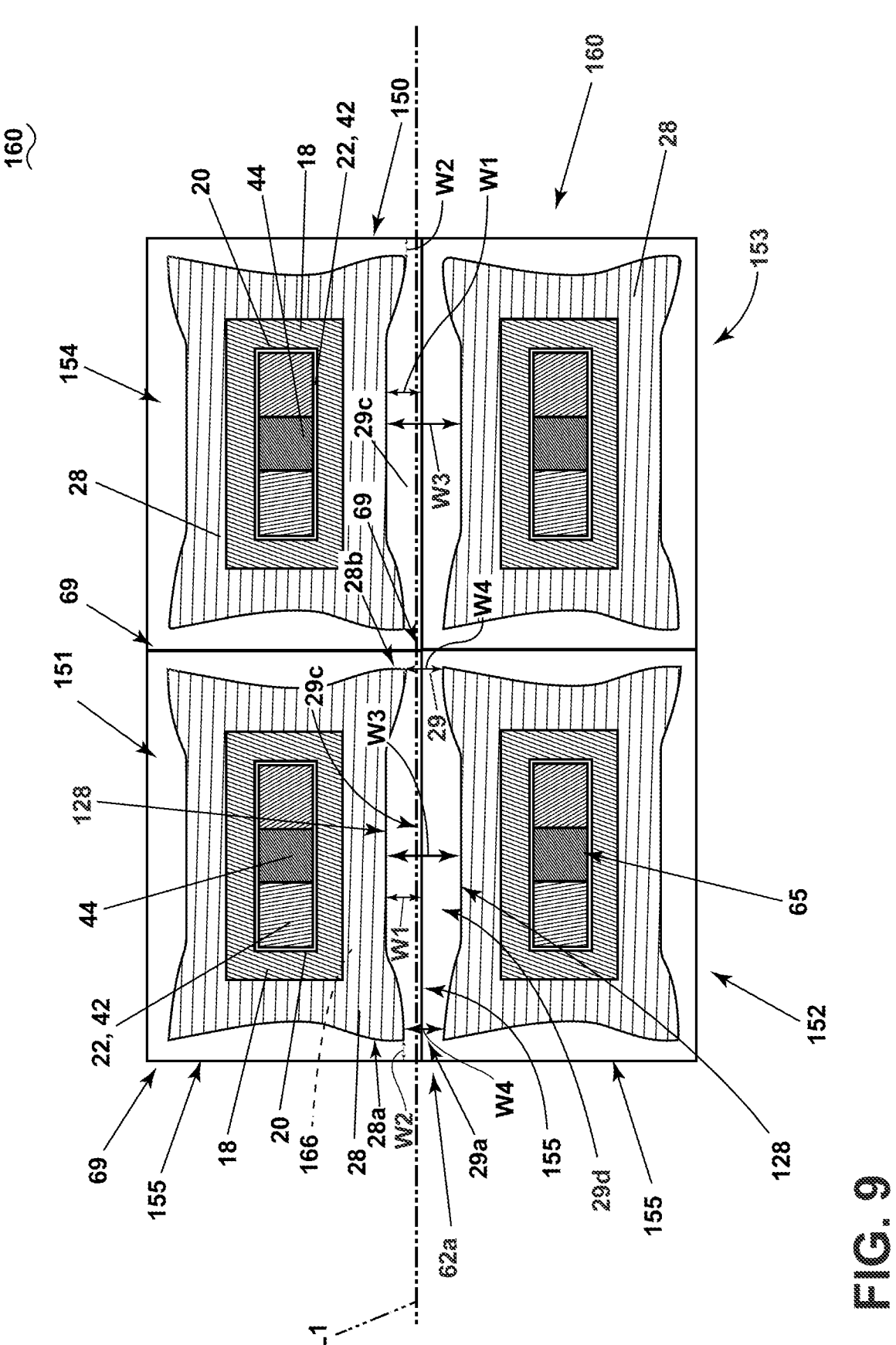
FIG. 9 is a top-down view of a system comprising a cellular array of semiconductor device cells in accordance with various aspects described herein.

FIG. 9 depicts a top-down or plan view illustrating a system 170 (e.g., a cellular semiconductor device 160 such as a MOSFET) comprising a cellular array of square semiconductor device cells 150 in accordance with a non-limiting aspect The non-limiting aspect of FIG. 9 is similar to the aspect depicted in FIG. 8, with one difference being that FIG. 9 comprises a set of semiconductor device cells 150 arranged in an aligned cellular type layout. As used herein, two semiconductor device cells 150 may be referred to as neighboring cells or adjacent cells when any portion of the boundaries of the two cells abut or touch (e.g., along a portion of the cell periphery 155 or at a corner 69, or both, of the semiconductor device cells 150). As such, it may be appreciated that, each square semiconductor device cell 150 of FIG. 9 can have eight neighboring or adjacent semiconductor device cells 150.

As illustrated in FIG. 9, the set of semiconductor device cells 150 can include a first, a second, a third and a fourth adjacent cell 151, 152, 153, 155 and second adjacent cell 152. It should be appreciated that while the illustrated example of FIG. 9 depicts a set of semiconductor device cells 150 having a rectangular or square geometry, other aspects are not so limited. In other non-limiting aspects, the semiconductor device cells 150 can have any other desired geometry or shape including, without limitation elongated rectangular, hexagonal, rounded, curved, varying width, elongated or distorted shapes, and various combinations thereof. As described in more detail herein, the semiconductor device cells 150 can be configured to enable a reduced ON-state resistance Rds(on) of the semiconductor device 160. Each semiconductor device cell 150 can be disposed at the first surface 4 of a semiconductor layer 2 (e.g., a silicon carbide (SiC) semiconductor layer).

As shown, the JFET region 29 can be arranged about the cell periphery 155 of each respective semiconductor device cell 150. The first and second corner regions 29a, 29b of the JFET region 29 can be defined at the cell periphery 155 and can define the corners 69 for each semiconductor device cell 150. At least a portion of the JFET region 29 about the cell periphery 155 of at least one of the adjacent semiconductor device cells 150, (e.g., the first adjacent cell 151) can define the longitudinal axis L1 and have the first corner region 29a and opposing second corner region 29b separated by the JFET intermediate region 29c. In non-limiting aspects, a respective first corner 28a of the channel region 28 of the first adjacent cell can be proximal to the JFET first corner region 29a, and a second corner 28b of the channel region 28 can be proximal to the JFET second corner region 29b.

When arranged as an aligned cellular array, the JFET region 29 of two adjacent semiconductor device cells 150, for example, the first adjacent cell 151 and the second adjacent cell 152, can abut along a portion of the cell periphery 155 of the first and second adjacent cells 151, 152. In this way, the abutting JFET regions 29 of the first adjacent cell 151 and the second adjacent cell 152, can define a shared JFET region 29d.

The abutting JFET regions 29 (i.e., the shared JFET region 29d) can define a third width W3. The third width W3 can extend across abutting JFET intermediate regions 29c of the first and second adjacent cells 151, 152, orthogonal to the longitudinal axis L1. In non-limiting aspects, the third width W3 can extend from edge of the periphery of the JFET intermediate region 29c abutting the channel region 28 of the first adjacent cell 151, across the abutting JFET regions 29 of the first and second adjacent cells 151, 152 to the periphery 128 of the channel region 28 of the second adjacent cell 152. In general, the third width W3 can be defined as the shortest distance across the JFET region 29 of the first adjacent cell 151 and JFET region 29 of the second adjacent cell 152, between regions (e.g., channel regions 28) having the opposite doping type (e.g., p-type) compared that of the JFET region 29 (e.g., n-type).

The abutting JFET regions 29 can define a fourth width W4. The fourth width W4 can extend across the JFET regions 29 of the first and second adjacent cells 151, 152, orthogonal to the longitudinal axis L1 and proximal to at least one of the first corner region 29a and second corner regions 29b of the first and second adjacent cells 151, 152. In non-limiting aspects, the fourth width W4 can extend from an edge of the periphery of the channel region 28 (e.g., at a respective first or second corner 28a, 28b) of a particular first adjacent cell 151, across the JFET region to the periphery of the channel region 28 of a second adjacent cell 152 (e.g., at a corresponding first or second corner 28a, 28b). In aspects, the fourth width W4 can extend from an edge of one of the first corner region 29a or second corner region 29b of the JFET region 29 abutting the periphery of the channel region 28 of the first adjacent cell 151, across the JFET regions 29 of the first and second adjacent cells 151, 152, to the periphery of the channel region 28 of the second adjacent cell 152. In general, the fourth width W4 can be defined as the shortest distance across the JFET region 29 of the first adjacent cell 151 and JFET region 29 of the second adjacent cell 152, from a corner 28a, 28b of the channel region 28 of the first adjacent cell 151 having the opposite doping type (e.g., p-type) compared that of JFET region 29 (e.g., n-type) to a corner 28a, 28b of the channel region 28 of the second adjacent cell 152 having the opposite doping type (e.g., p-type) compared that of JFET region 29 (e.g., n-type).

In non-limiting aspects, the third width W3 can be equal to a sum of a respective first width W1 of the first adjacent cell and the first width W1 of the second adjacent cell 152. Similarly, in non-limiting aspects, the fourth width W4 can equal to a sum of respective second width W2 of the first adjacent cell and the second width W2 of the second adjacent cell 152. In non-limiting aspects, the fourth width W4 defined by the first and second adjacent cells 151, 152 can be greater than the third width W3 defined by the first and second adjacent cells 151, 152.

In non-limiting aspects, the third width W3 can be about 1.3 microns, and the fourth width W4 can be about 0.45 microns. In other aspects, the third width W3 can be within a range of 0.5-2.2 microns, and the fourth width W4 can be within a range of 0.2-0.9 microns. In still other aspects, the third width W3 can be at least 20% wider than the fourth width W4.

Other aspects are not so limited, and the dimensions of the third width W3, or the fourth width W4, or both, can vary as desired for various applications without departing from the scope of the disclosure herein. Regardless of the dimensions, or relative dimensions with respect to each other, or both, of the third width W3 and fourth width W4 are arranged or defined with the particular purpose of decreasing the ON-state resistance contribution of the respective JFET regions 29 of the set of semiconductor device cells 150, while maintaining robustness to breakdown voltages between the corners of neighboring device cells 150.

It may be appreciated that the disclosed aspects provide for a reduction in ON state resistance of semiconductor device cells 150 over conventional techniques by increasing a width of the JFET region 29 at the cell periphery 155, away from the first and second corner regions 29a, 29b without modifying (e.g., reducing or increasing) the dimensions of the channel region corners 28a, 28b proximal to the respective corners 69 of the cell, thereby avoiding or reducing an increase in the of electric field at the respective corners 69 of the cell which may result in improved long-term reliability for these semiconductor device cells 150.

Thus, the presently disclosed semiconductor device cell 150 reduces device conduction losses (e.g., minimizes the ON-state resistance Rds(on)) by providing increased width of portions of the JFET region without decreasing the distance between the channel regions 28 at the corners 69 of adjacent semiconductor device cells 150.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The features disclosed in the foregoing description, in the following claims and/or in the accompanying drawings may, both separately and in any combination thereof, be material for realizing embodiments in diverse forms thereof.

Various characteristics, aspects and advantages of the present disclosure may also be embodied in any permutation of aspects of the disclosure, including but not limited to the following technical solutions as defined in the enumerated aspects:

A system (160) comprising: a semiconductor device cell (150) comprising a semiconductor layer (2) including a drift region (16) having a first conductivity type; a well region (18) having a second conductivity type disposed adjacent to the drift region (16); a source region (20) having the first conductivity type disposed adjacent to and surrounded by the well region (18); a channel region (28) having the second conductivity type, disposed around and adjacent to the well region (18); and a JFET region (29) abutting a periphery of the channel region (128) and defining a semiconductor cell periphery (155) the JFET region having at least a first corner (69a), a second corner (69b), separated by a JFET intermediate region (29c), wherein a first width W1 of the JFET intermediate region (29c) extending from an edge of the JFET intermediate region (29c) abutting the periphery of the channel region (128) to the semiconductor cell periphery (155) is greater than a second width W2 of the JFET region (29) extending from an edge of at least one of the first and second corner (69a), (69b) abutting the periphery of the channel region (128) to the semiconductor cell periphery (155).

The system (160) of the preceding clause, wherein each of the first corner region (269a) and the second corner region (29b) define a right angle.

The system (160) of any preceding clause, wherein the channel region (28) defines a third corner region (28a) proximal to the first corner region 29a.

The system (160) of any preceding clause, wherein the channel region (28) defines a fourth corner region (28b), proximal the second corner region (29b).

The system (160) of any preceding clause, wherein the JFET region (29) extends from the channel region (28) to the semiconductor cell periphery (155).

The system (160) of any preceding clause, wherein the first width (W1) is within a range of 6 microns and 18 microns.

The system (160) of any preceding clause, wherein the second width (W2) is within a range of 0.07 microns and 1.4 microns.

The system (160) of any preceding clause, wherein the first width (W1) is at least 20% wider than the second width (W2).

The system (160) of any preceding clause, wherein the semiconductor device cell (150) is a MOSFET device (10).

The system (160) of claim 1, further comprising: a set of semiconductor device cells (151, 152, 153, 154) at least partially disposed in the semiconductor device layer (2) having the first conductivity type, wherein each device cell respectively comprises: semiconductor layer (2) including a drift region (16) having a first conductivity type; a well region (18) having a second conductivity type disposed adjacent to the drift region (16); a source region (20) having the first conductivity type disposed adjacent to and surrounded by the well region (18); a channel region (28) having the second conductivity type, disposed around and adjacent to the well region (18); and a JFET region (29) abutting a periphery of the channel region (128) and defining a semiconductor cell periphery (155) the JFET region having at least a first corner (69a), a second corner (69b), separated by a JFET intermediate region (29c), wherein a first width W1 of the JFET intermediate region (29c) extending from an edge of the JFET intermediate region (29c) abutting the periphery of the channel region (128) to the semiconductor cell periphery (155) is greater than a second width W2 of the JFET region (29) extending from an edge of at least one of the first and second corner (69a), (69b)

abutting the periphery of the channel region (128) to the semiconductor cell periphery (155).

The system (160) of any preceding clause, wherein each semiconductor device cell (150) comprises a respective semiconductor cell periphery (155) aligned with a respective semiconductor cell periphery (155) of an adjacent semiconductor device cell (150).

The system (160) of any preceding clause, wherein a respective JFET intermediate region (29c) of a first semiconductor device cell (151) and a second semiconductor device cell (152) abut along a portion of the respective semiconductor cell periphery (155) of the first and second semiconductor device cells (151, 152) to define a shared JFET region (29d) between the of the first and second semiconductor device cells (151, 152).

The system (160) of any preceding clause, wherein the respective channel regions (28) of the first semiconductor device cell (151) and the second semiconductor device cell (152) are separated by the respective JFET (29) regions of the first and second semiconductor device cells (151, 152).

The system (160) of any preceding clause, wherein a third width (W3) of the shared JFET region, is greater than a fourth width (W4) between the respective channel regions (28) of the first semiconductor device cell (151) and the second semiconductor device cell (152) at least one of the respective first corner region (29a) and the second corner region (29b).

The system (160) of any preceding clause, wherein the third width W3 is equal to a sum of a respective first width (W1) the first semiconductor device 151 and a respective first width (W1) of the second semiconductor device cell 152.

The system (160) of any preceding clause, wherein the fourth width (W4) is equal to a sum of a respective second width (W2) the first semiconductor device cell (151) and a respective second width (W2) of the second semiconductor device cell (152).

The system (160) of any preceding clause, wherein the first axial width (W1) is within a range of 12 microns and 36 microns.

The system (160) of any preceding clause, wherein the second axial width (W2) is within a range of 0.14 microns and 2.8 microns.

The system (160) of any preceding clause, wherein the first width (W1) is at least 20% wider that the second width (W2).

The system (160) of any preceding clause, wherein the semiconductor device cells (150) collectively define a MOSFET (10).

A semiconductor device cell (150) comprising: a semiconductor layer (2) including a drift region(16) having a first conductivity type; a well region (18) having a second conductivity type disposed adjacent to the drift region (16); a source region (20) having the first conductivity type disposed adjacent to and surrounded by the well region (18); a channel region (28) having the second conductivity type, disposed around and adjacent to the well region (18); and a JFET region (29) abutting a periphery of the channel region (128) and defining a semiconductor cell periphery (155) the JFET region having at least a first corner (69a), a second corner (69b), and a JFET intermediate region (29c) having a first end disposed (29a) proximal the first corner (69a) and an opposing second end (29b) proximal the second corner (69b), wherein a first width W1 of the JFET intermediate region (29c) extending from an edge of the JFET intermediate region (29c) abutting the periphery of the channel region (128) to the semiconductor cell periphery (155) is greater than a second width W2 of the JFET region (29) extending from an edge of at least one of the first and second corner (69a), (69b) abutting the periphery of the channel region (128) to the semiconductor cell periphery (155).

The semiconductor device cell (150) of the preceding clause, wherein each of the first corner region (29a) and second corner region (29b) define a right angle.

The semiconductor device cell (150) of any preceding clause, wherein the channel region (28) defines a third corner region (28a) proximal to the first corner region (29a).

The semiconductor device cell (150) of any preceding clause, wherein the channel region (28) defines a fourth corner region (28b), proximal the second corner region (29b).

The semiconductor device cell (150) of any preceding clause, wherein the JFET region (29) extends from the channel region (28) to the semiconductor cell periphery (155).

The semiconductor device cell (150) of any preceding clause, wherein the first width (W1) is within a range of 6 microns and 18 microns.

The semiconductor device cell (150) of any preceding clause, wherein the second width (W2) is within a range of 0.07 microns and 1.4 microns.

The semiconductor device cell (150) of any preceding clause, wherein the first width (W1) is at least 20% wider that the second width (W2).

The semiconductor device cell (150) of any preceding clause, wherein the semiconductor device cell (150) is a MOSFET device (10).

A system (160) comprising: a set of semiconductor device cells (150) at least partially disposed in a semiconductor layer (2) having a first conductivity type, wherein each device cell (150) respectively comprises: a semiconductor layer (2) including a drift region (16) having a first conductivity type; a well region (18) having a second conductivity type disposed adjacent to the drift region; a source region (20) having the first conductivity type disposed adjacent to and surrounded by the well region (18); a channel region (28) having the second conductivity type, disposed around and adjacent to the well region (18), the channel region (28); and a JFET region (29) abutting a periphery (128) of the channel region (28) and defining a semiconductor cell periphery (155) and having at least a first corner (69a), a second corner(69b), and a JFET intermediate region (29c) having a first end disposed (29a) proximal the first corner (69a) and an opposing second end (29b) proximal the second corner (69b), wherein a first width W1 of the JFET intermediate region (29c) extending from an edge of the JFET intermediate region (29c) abutting the periphery of the channel region (128) to the semiconductor cell periphery (155) is greater than a second width W2 of the JFET region (29) extending from an edge of at least one of the first and second corner regions (29a), (29b) abutting the periphery of the channel region (128) to the semiconductor cell periphery (155).

The system (160) of any preceding clause, wherein each semiconductor device cell (150) comprises a respective semiconductor cell periphery (155) aligned with a respective semiconductor cell periphery (155) of an adjacent semiconductor device cell (150).

The system (160) of any preceding clause, wherein a respective JFET intermediate region (29c) of a first semiconductor device cell (151) and a second semiconductor device cell (152) abut along a portion of the respective semiconductor cell periphery (155) of the first and second semiconductor device cells (151, 152) to define a shared JFET region (29d) between the of the first and second semiconductor device cells (151, 152).

The system (160) of any preceding clause, wherein the respective channel regions (28) of the first semiconductor device cell (151) and the second semiconductor device cell (152) are separated by the respective JFET (29) regions of the first and second semiconductor device cells (151, 152).

The system (160) of any preceding clause, wherein a third width (W3) of the shared JFET region (29d) is greater than a fourth width (W4) between the respective channel regions (28) of the first semiconductor device cell (151) and the second semiconductor device cell (152) at at least one of the first corner region (29a) and the second corner region (29b).

The system (160) of any preceding clause, wherein the third width W3 is equal to a sum of a respective first width (W1) of the first semiconductor device 151 and a respective first width (W1) of the second semiconductor device cell 152.

The system (160) of any preceding clause, wherein the fourth width (W4) is equal to a sum of a respective second width (W2) the first semiconductor device cell (151) and a respective second width (W2) of the second semiconductor device cell (152).

The system (160) of any preceding clause, wherein the first width (W1) is within a range of 12 microns and 36 microns.

The system (160) of any preceding clause, wherein the second width (W2) is within a range of 0.14 microns and 2.8 microns.

The system (160) of any preceding clause, wherein the first width (W1) is at least 20% wider that the second width (W2).

The system (160) of any preceding clause, wherein the semiconductor device cells (150) define a MOSFET (10).

What is claimed is:

1. A semiconductor device cell comprising:
a well region having a second conductivity type;
a source region having a first conductivity type disposed adjacent to and surrounded by the well region,
a channel region having the second conductivity type, disposed around and adjacent to the well region; and
a JFET region abutting a periphery of the channel region and defining a semiconductor cell periphery, the JFET region having at least a first corner region and a second corner region separated by a JFET intermediate region, wherein a first width of the JFET intermediate region is greater than a second width of the JFET region,
wherein the first width of the JFET intermediate region extends across the JFET intermediate region from an edge of the JFET intermediate region abutting the periphery of the channel region to the semiconductor cell periphery,
wherein the second width of the JFET intermediate region extends from an edge of at least one of the first and the second corner regions abutting the periphery of the channel region to the semiconductor cell periphery, and
wherein a boundary between the well region and the channel region is rectangular.

2. The semiconductor device cell of claim 1, wherein each of the first corner region and second corner region define a right angle.

3. The semiconductor device cell of claim 1, wherein the channel region defines a third corner region proximal to the first corner region.

4. The semiconductor device cell of claim 3, wherein the channel region defines a fourth corner region, proximal the second corner region.

5. The semiconductor device cell of claim 1, wherein the first width is within a range of 6 microns and 18 microns.

6. The semiconductor device cell of claim 1, wherein the second width is within a range of 0.07 microns and 1.4 microns.

7. The semiconductor device cell of claim 1, wherein the first width is at least 20% wider than the second width.

8. A system, comprising:

a plurality of semiconductor device cells, wherein each of the plurality of semiconductor cells comprises:

a well region having a second conductivity type;

a source region having a first conductivity type disposed adjacent to and surrounded by the respective well region;

a channel region having the second conductivity type, disposed around and adjacent to the respective well region; and a JFET region abutting a periphery of the respective channel region and defining a respective semiconductor cell periphery, the JFET region having at least a first corner region and a second corner region separated by a JFET intermediate region, wherein a first width of the JFET intermediate region is greater than a second width of the JFET region, wherein the first width of the JFET intermediate region extends across the JFET intermediate region from an edge of the JFET intermediate region abutting the periphery of the channel region to the semiconductor cell periphery, wherein the second width of the JFET intermediate region extends from an edge of at least one of the first and the second corner regions abutting the periphery of the channel region to the semiconductor cell periphery, and wherein a boundary between the well region and the channel region is rectangular.

9. The system of claim 8, wherein the respective semiconductor cell periphery of each semiconductor device cell is aligned with a respective semiconductor cell periphery of an adjacent semiconductor device cell.

10. The system of claim 8, wherein a respective JFET intermediate region of a first semiconductor device cell and a JFET intermediate region of a second semiconductor device cell abut along a portion of the respective semiconductor cell periphery of the first and second semiconductor device cells to define a shared JFET region between the of the first and second semiconductor device cells.

11. The system of claim 10, wherein the respective channel regions of the first semiconductor device cell and the second semiconductor device cell are separated by the respective JFET regions of the first and second semiconductor device cells.

12. The system of claim 10, wherein a third width of the shared JFET region, is greater than a fourth width between the respective channel regions of the first semiconductor device cell and the second semiconductor device cell at one or more of the first corner region or the second corner region.

13. The system of claim 12, wherein the third width is equal to a sum of a respective first width of the first semiconductor device cell and a respective first width of the second semiconductor device cell.

14. The system of claim 12, wherein the fourth width is equal to a sum of a respective second width the first semiconductor device cell and a respective second width of the second semiconductor device cell.

15. The system of claim 11, wherein the first width is within a range of 12 microns and 36 microns.

16. The system of claim 11, wherein the second width is within a range of 0.14 microns and 2.8 microns.

17. The system of claim 11, wherein the first width is at least 20% wider that the second width.

18. The system of claim 8, wherein the semiconductor device cells collectively define a MOSFET.

\* \* \* \* \*